United States Patent
Liu

(10) Patent No.: US 9,281,974 B1
(45) Date of Patent: Mar. 8, 2016

(54) EQUALIZER CIRCUITRY HAVING DIGITALLY CONTROLLED IMPEDANCES

(71) Applicant: Altera Corporation, San Jose, CA (US)

(72) Inventor: Wing Liu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 480 days.

(21) Appl. No.: 13/758,739

(22) Filed: Feb. 4, 2013

(51) Int. Cl.
*H03H 7/30* (2006.01)
*H03H 7/40* (2006.01)
*H03K 5/159* (2006.01)
*H04L 27/01* (2006.01)

(52) U.S. Cl.
CPC .................................... *H04L 27/01* (2013.01)

(58) Field of Classification Search
None
See application file for complete search history.

(56) References Cited

U.S. PATENT DOCUMENTS

| | | |
|---|---|---|
| 4,374,426 A | 2/1983 | Burlage et al. |
| 6,870,404 B1 * | 3/2005 | Maangat .................. 327/65 |
| 7,254,173 B1 | 8/2007 | Fu et al. |
| 7,301,997 B1 | 11/2007 | Wang et al. |
| 7,598,811 B2 * | 10/2009 | Cao ......................... 330/304 |
| 8,254,402 B2 | 8/2012 | Keady et al. |
| 8,295,296 B2 | 10/2012 | Keady et al. |

* cited by examiner

*Primary Examiner* — Anh Tran

(57) ABSTRACT

An integrated circuit is disclosed. The integrated circuit includes an equalizer circuit that may provide high-frequency signal amplification. The equalizer circuit also has adjustable impedance circuitry, which may receive digital control signals to adjust the effective impedance of the equalizer circuit. Furthermore, a method of operating the equalizer circuit is also disclosed.

19 Claims, 6 Drawing Sheets

EQUALIZER CIRCUITRY HAVING DIGITALLY CONTROLLED IMPEDANCES

BACKGROUND

Integrated circuits typically include transceiver circuitry having an equalizer circuit. The equalizer circuit may be utilized to reduce distortions in a signal propagating through a transmission channel. There are many types of equalizer circuits that have different structures and properties (e.g., linear equalizers and feedback equalizers).

The current generation of transceivers often uses linear equalizers to reduce distortion in a transmission signal. A conventional linear equalizer has its capacitance and resistance controlled by analog signals. Therefore, the analog signals may effectively control a transfer function associated with the linear equalizer circuitry.

However, analog signals are generally known to be more sensitive to signal noise generated by circuits that surround the linear equalizer circuit. Controlling the linear equalizer circuit with analog signals is also known to exhibit low bandwidth and heightened inter-symbol interference (ISI). The linear equalizer circuit also requires a digital-to-analog converter (DAC) as most of the circuits supporting the linear equalizer circuit are generally digital circuits.

It is within this context that the embodiments described herein arise.

SUMMARY

Embodiments described herein include an equalizer circuit with digitally controlled impedances. It should be appreciated that the embodiments can be implemented in numerous ways, such as a process, an apparatus, a system, a device, or a method. Several embodiments are described below.

In one embodiment, an equalizer circuit having digitally controlled impedance is described. Digital control signals may be used to control the capacitance of the equalizer circuit. The equalizer circuit may exhibit a relatively good bandwidth and ISI compensation for signal transmission compared to the conventional equalizer circuit. Furthermore, the equalizer circuit does not require a DAC circuit.

In one embodiment, an integrated circuit is disclosed. The integrated circuit has an equalizer circuit that is used to provide high-frequency signal amplification. The equalizer circuit also has adjustable impedance circuitry, which may receive digital control signals to adjust the equalizer circuit's effective impedance.

In another embodiment, a channel equalizer circuit is disclosed. The channel equalizer circuit includes first and second output terminals, first and second input transistors, and adjustable impedance circuitry. Both of the first and second input transistors include first and second source-drain terminals. The first source-drain terminal of the first input transistor may be coupled to the first output terminal, whereas the first source-drain terminal of the second input transistor may be coupled to the second output terminal. The adjustable impedance circuitry includes a first terminal that is coupled to the second source-drain terminal of the first input transistor, a second terminal that is coupled to the second source-drain terminal of the second input transistor, and control terminals operable to receive digital signals for adjusting an impedance of the adjustable impedance circuitry.

In an alternative embodiment, a method of operating an equalizer circuit is disclosed. The method includes receiving a first set of digital control signals with an adjustable impedance circuit in the equalizer circuit so that the equalizer circuit exhibits a first high-frequency amplifying characteristic. Subsequently, the method includes receiving of a second set of digital control signals with the adjustable impedance circuit in the equalizer circuit so that the equalizer circuit exhibits a second high-frequency amplifying characteristic that is different than the first high-frequency boosting characteristic.

Further features of the invention, its nature and various advantages will be more apparent from the accompanying drawings and the following detailed description of the preferred embodiments.

DETAILED DESCRIPTION

The following embodiments describe an equalizer circuit with digitally controlled impedances. It will be obvious, however, to one skilled in the art that the present exemplary embodiments may be practiced without some or all of these specific details. In other instances, well-known operations have not been described in detail in order not to unnecessarily obscure the present embodiments.

Figure 1:
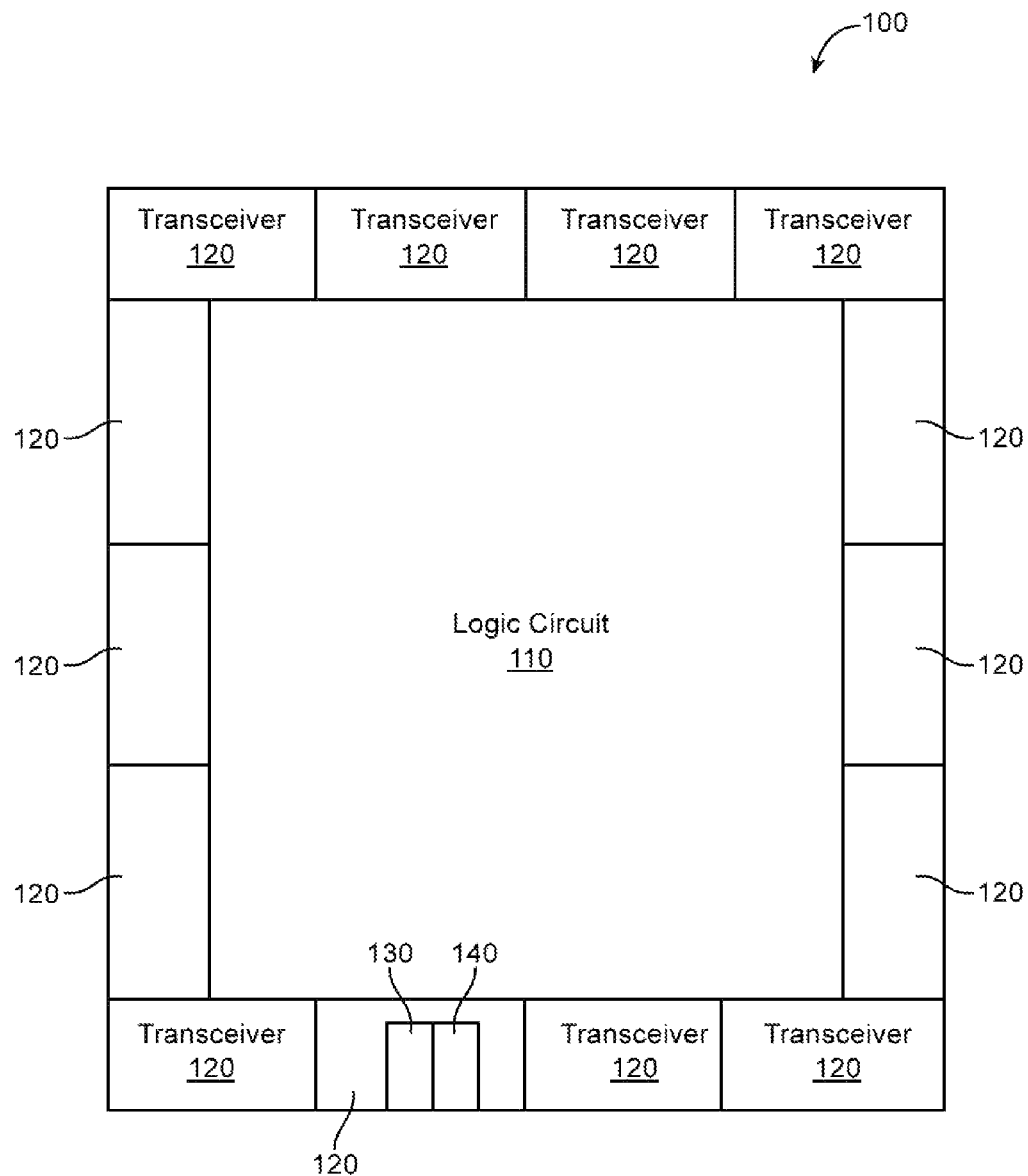
FIG. 1 shows an illustrative integrated circuit (IC) in accordance with one embodiment of the present invention.

FIG. 1, meant to be illustrative and not limiting, shows an integrated circuit (IC) 100 in accordance with one embodiment of the present invention. Integrated circuit 100 includes a plurality of transceivers 120 and logic circuit 110. Integrated circuit 100 may be an Application Specific Integrated Circuit (ASIC) device or an Application Specific Standard Product (ASSP) device. Alternatively, integrated circuit 100 may be a programmable logic device (PLD).

Transceivers 120 may be formed at the peripheral edges of integrated circuit 100 whereas logic circuit 110 may be formed at the middle portion of integrated circuit 100. However, it should be appreciated that logic circuit 110 and transceivers 120 may be arranged differently than that depicted in the embodiment of FIG. 1 without departing from the scope and spirit of the invention.

Integrated circuit 100 may be utilized to meet a range of telecommunication needs. In one embodiment, integrated circuit 100 may be made available in a wireless radio communication system. Within the wireless radio communication system, integrated circuit 100 may play a critical role in transferring signals across different transmission channels.

Logic circuit 110, forming a large portion of integrated circuit 100, performs the core functions of integrated circuit 100. It should be appreciated that core functions of integrated circuit 100 may depend on the type of integrated circuit 100. For example, logic circuit 110 may be utilized for processing a signal when integrated circuit 100 is a microprocessor device. Alternatively, logic circuit 110 may be utilized for storing data when integrated circuit 100 is a memory device. Logic circuit 110 may further include programmable logic elements when integrated circuit 100 is a PLD. The programmable logic elements can accordingly be configured to perform various functions as desired.

Transceivers 120 may transmit or receive signals for integrated circuit 100. A transceiver 120 may be coupled to an input-output (I/O) pin, which may then be further coupled to a transmission channel. Therefore, transceivers 120 serve as interfacing circuitry between a transmission channel and logic circuit 110. In one embodiment, transceivers 120 may also be configured to receive different types of signals. For example, transceivers 120 may be programmed according to a specific I/O standard such as Low-Voltage Differential Signaling (LVDS), High Speed Transceiver Logic (HSTL), etc.

Transceivers 120 may include transmitter circuitry 130 and receiver circuitry 140, as illustrated in one of the plurality of transceivers 120 in FIG. 1. Transmitter circuitry 130 may be utilized for transmitting signals out of integrated circuit 100 whereas receiver circuitry 140 may be utilized for receiving signals from other external circuits that may be coupled to integrated circuit 100. In one embodiment, transmitter circuitry 130 and receiver circuitry 140 may include circuit elements as shown in transmitter circuitry 130A and receiver circuitry 140B, respectively, in FIG. 2. If desired, a transmission channel may be coupled to transmitter circuitry 130 and another transmission channel may be coupled to receiver circuitry 140. The transmission channels provide pathways to carry signals in/out of integrated circuit 100.

In the embodiment of FIG. 1, the transmitted signals and received signals may be analog signals or digital signals. Furthermore, the signals may also include differential or single-ended signals. In the instance when transceivers 120 are programmable, transceivers 120 may be configured to transmit or receive differential signals in one instance and may be configured to transmit or receive single-ended signals in another instance.

Figure 2:
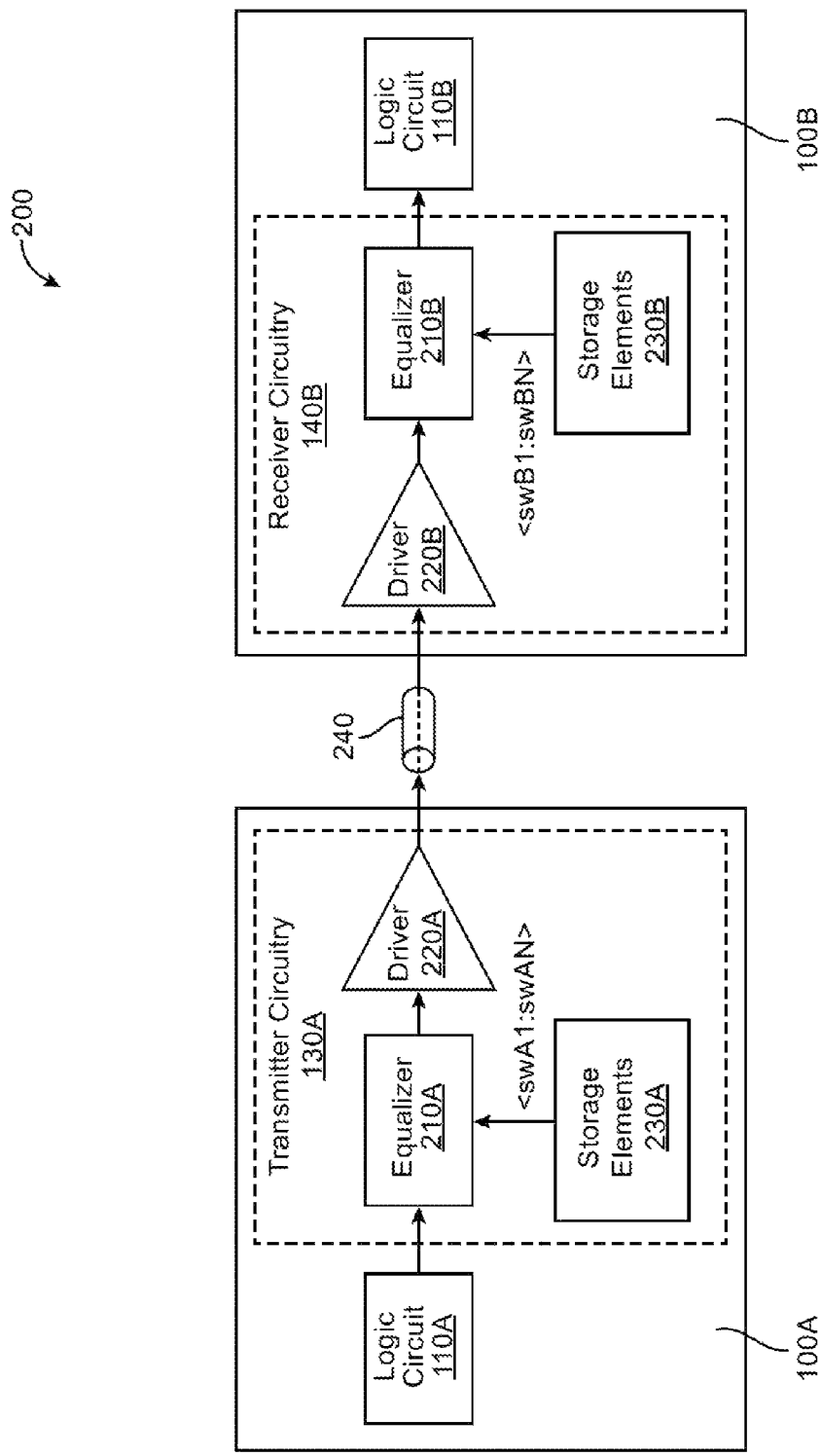
FIG. 2 shows an illustrative communication system that includes two integrated circuits in accordance with one embodiment of the present invention.

FIG. 2, meant to be illustrative and not limiting, illustrates a communication system that includes two integrated circuits in accordance with one embodiment of present invention. Communication system 200 includes integrated circuits 100A and 100B and transmission channel 240. In one embodiment, communication system 200 may be a wireless radio communication system. Integrated circuits 100A and 100B may individually be similar to integrated circuit 100 of FIG. 1. In FIG. 2, integrated circuit 100A includes logic circuit 110A and transmitter circuitry 130A and integrated circuit 100B includes logic circuit 110B and receiver circuitry 140B. Transmitter circuitry 130A may include a plurality of sub-circuits such as equalizer circuit 210A, driver circuit 220A and storage elements 230A. Receiver circuitry 140B may also include a plurality of sub-circuits, such as equalizer circuit 210B, driver circuit 220B and storage elements 230B. It should be appreciated that, in order to not unnecessarily obscure the present invention, other circuit elements that may be included in integrated circuits 100A and 100B are not shown in FIG. 2.

Referring still to FIG. 2, signals may be transferred from integrated circuit 100A to integrated circuit 100B. Specifically, the signals may be transferred from transmitter circuit 130A of integrated circuit 100A to receiver circuit 140B of integrated circuit 100B. The signal may travel from integrated circuit 100A to integrated circuit 100B through transmission channel 240 (e.g. wires or other conductive traces). In one embodiment, the signals may be generated by logic circuit 110A. The signals may subsequently be transferred to transmitter circuit 130A, and specifically equalizer circuit 210A, through electrical interconnections (not shown in FIG. 2) available within integrated circuit 100A.

Equalizer circuit 210A may reduce or cancel frequency-dependent attenuations imparted to the signal by transmission channel 240. In one instance, equalizer circuit 210A may reduce or cancel the frequency-dependent attenuations by amplifying the high frequency components of the signal. Equalizer circuit 210A may be a linear equalizer circuit (e.g., a continuous time linear equalizer (CTLE) circuit as illustrated by equalizer circuit 300 of FIG. 3) or an adaptive equalizer circuit (e.g., a decision feedback equalizer circuit).

In one embodiment, equalizer circuit 210A may be controlled using signals swA1:swAN that are received from storage elements 230A. The controlling signals swA1:swAN may be digital signals. The number of control signals needed may depend on the number of elements (e.g., the number of adjustable-capacitance elements 500 of FIG. 4) within equalizer circuit 210A.

Storage elements 230A may include a mass-storage memory module, such as a non-volatile memory module or a volatile memory module. In an exemplary embodiment, storage elements 230A may include a dynamic random access memory (DRAM) module or a static random access memory (SRAM) module. Generally, a mass-storage memory module may include memory cells in one or more memory cell arrays. In one embodiment, storage elements 230A may include at least N memory cells, which may store at least N bits of information. Furthermore, the mass-storage memory module may be located in transmitter circuit 130A (as illustrated in FIG. 2), within logic circuit 110A or elsewhere on the device. Storage elements 230A may also be a part of another integrated circuit device or a part of multiple integrated circuit devices.

After equalization, the equalized signal may be transferred from equalizer circuit 210A to driver circuit 220A. Driver circuit 220A, together with another circuit (e.g., an I/O circuit), may transfer the equalized signal out of integrated circuit 100A. In the embodiment of FIG. 2, the equalized signal is transmitted from integrated circuit 100A to transmission channel 240.

Transmission channel 240 generally refers to a physical transmission medium (e.g., wires). Transmission channel 240 may connect a sending device (e.g., integrated circuit 100A) to a receiving device (e.g., integrated circuit 100B). There may be multiple transmission channels 240 (e.g., in the form of multiple data transmission lines) between the sending and receiving devices. It should be appreciated that transmission channel 240 may be implemented in various ways, for example, according to the OSI layer model.

Generally, communication performance between the sending and receiving devices may deteriorate over time. For example, noise may cause signal attenuation in signals being transmitted across transmission channel 240. In the case of wired communications, the performance may deteriorate as signals attenuate due to physical factors such as wire resistance. The communication performance may also deteriorate when the bandwidth of transmission channel 240 is relatively small when compared to the bandwidth of the transmitted signal. Generally, this deterioration may be noticeable in high speed signal protocols. In such circumstances, having a small bandwidth transmission channel impairs the high frequency components of the signal being transmitted.

Signals from transmission channel 240 are received by integrated circuit 100B, specifically by driver circuit 220B in receiver circuit 140B. Similar to driver circuit 220A, driver circuit 220B transfers the received signals to equalizer circuit 210B.

In one embodiment, equalizer circuit 210B may be similar to equalizer circuit 210A of integrated circuit 100A. Equalizer circuit 210B may amplify high frequency components of the received signal, which may be distorted due to the relatively small bandwidth of transmission channel 240. Amplification is necessary to obtain a "flat" frequency response with respect to transmission channel 240. In one embodiment, the flat frequency response may refer to frequency response values within a range of 5% (maximum-minimum difference) over a band of frequencies, e.g. 200 megahertz (MHz) to 2 gigahertz (GHz). It should be appreciated that by not having a flat frequency response for the transmission channel, the transmitted signal may get distorted as a result of the filtering away of high frequency components from the transmitted signal.

Similar to equalizer circuit 210A, equalizer circuit 210B may also be controlled by a plurality of control signals, for example swB1:swBN, received from storage elements 230B. Storage elements 230B may also be similar to storage elements 230A. The equalized signal from equalizer circuit 210B is transferred to logic circuit 110B, which can then be transmitted to other blocks within logic circuit 110B or integrated circuit 100B.

Figure 3:
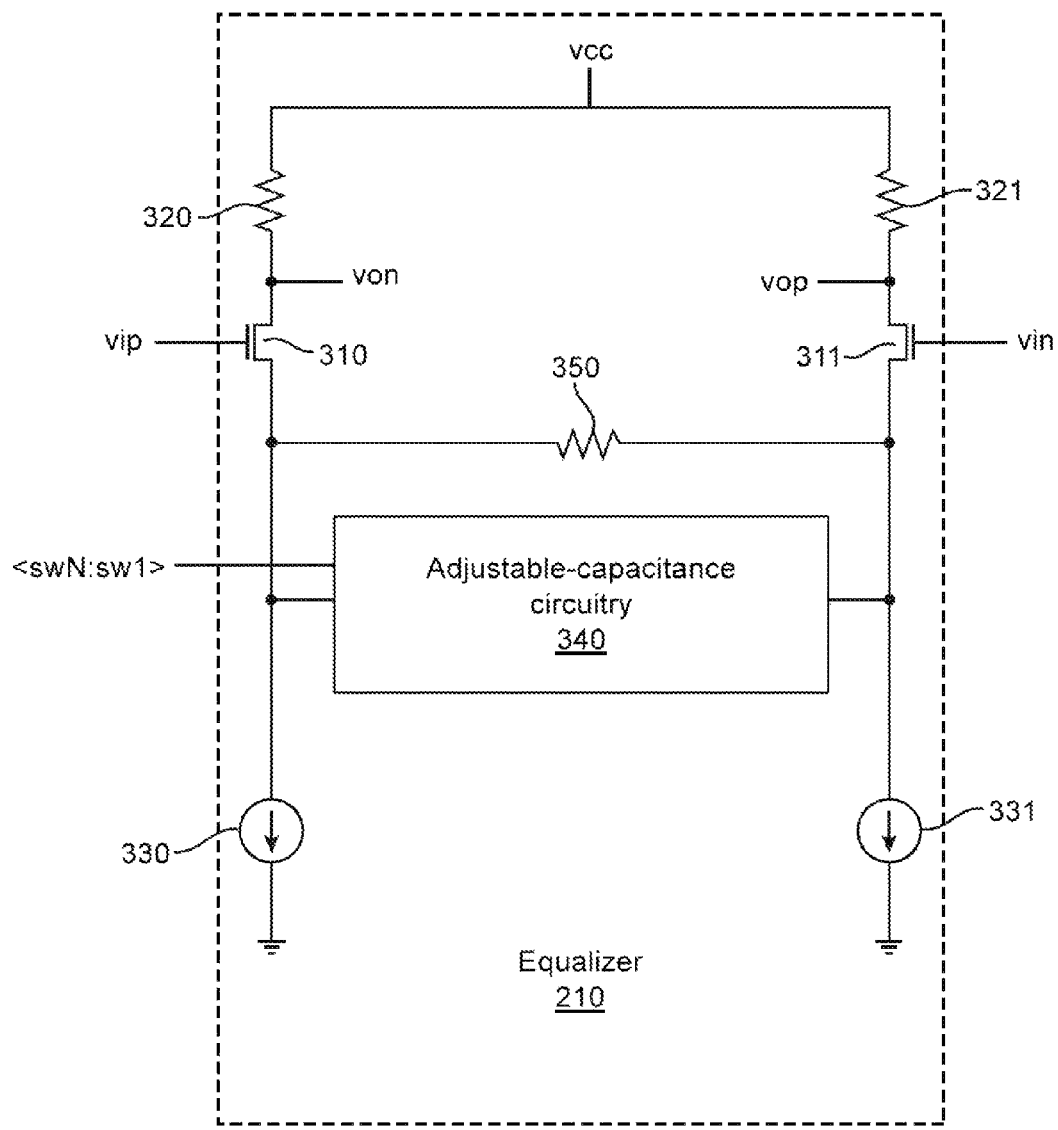
FIG. 3 shows an implementation of an illustrative equalizer circuit in accordance with one embodiment of the present invention.

FIG. 3, meant to be illustrative and not limiting, illustrates an implementation of an equalizer circuit in accordance with one embodiment of present invention. Equalizer circuit 210 may be similar to equalizer circuit 210A or 210B described in FIG. 2. The arrangement of the circuit elements in equalizer circuit 210 may be similar to a continuous time linear equalizer (CTLE) circuit. Equalizer circuit 210 includes resistors 320, 321 (both with a resistance value of $R_L$) and 350 (with a resistance value of $R_s$), n-channel transistors 310 and 311, current sources 330 and 331 and adjustable-capacitance circuitry 340. Equalizer circuit 210 receives input signals through positive input terminal (vip) and negative input terminal (Vin), and may output an equalized signal through positive output terminal (vop) and negative output terminal (Von). Equalizer circuit 210 also receives digital control signals, for example, digital control signals sw1:swn.

Each of resistors 320 and 321 may have one terminal coupled to a supply voltage (Vcc) and another terminal coupled to an output terminal (von terminal and vop terminal, respectively) and an n-channel transistor (n-channel transistors 310 and 311, respectively). In FIG. 3, resistor 320 is coupled to Von terminal and the drain terminal of NMOS transistor 310 whereas resistor 321 is coupled to vop terminal and the drain terminal of NMOS transistor 311.

N-channel transistor 310 has a gate terminal coupled to a positive input terminal (vip), a drain terminal coupled to resistor 320, and a source terminal coupled to node 351. N-channel transistor 311 has a gate terminal coupled to a negative input terminal (vin), a drain terminal coupled to resistor 321, and a source terminal coupled to node 352.

The input signal may be a differential input signal, which includes a positive differential input signal and a negative differential input signal. The positive differential signal may be received through the vip terminal and the negative differential input signal may be received through the vin terminal. Upon equalization, the equalized signal may also be a differential signal. Hence, a positive differential equalized signal may be output through the vop terminal whereas a negative differential equalized signal may be output through the von terminal. In the embodiment where equalizer circuit 210 forms a part of receiver circuitry, vip and vin terminals are coupled to a driver circuit (e.g., driver circuit 220B of FIG. 2), and vop and von terminals are coupled to a logic circuit (e.g., logic circuit 110B of FIG. 2). Alternatively, in the instance where equalizer circuit 210 forms a part of transmitter circuitry, vip and vin terminals are coupled to a logic circuit (e.g., logic circuit 110A of FIG. 2), and vop and von terminals may be coupled to a driver circuit (e.g., driver circuit 220A of FIG. 2).

Within equalizer circuit 210, the digital control signals sw1:swn may be used by adjustable-capacitance circuitry 340 to control the effective capacitance of equalizer circuit 210. The effective capacitance may be adjusted by providing a pathway to the capacitive elements within adjustable capacitance circuitry 340. The adjustment of the effective capacitance may alter the transfer function of equalizer circuit 210 and subsequently affect the input signal's bandwidth.

Figure 4:
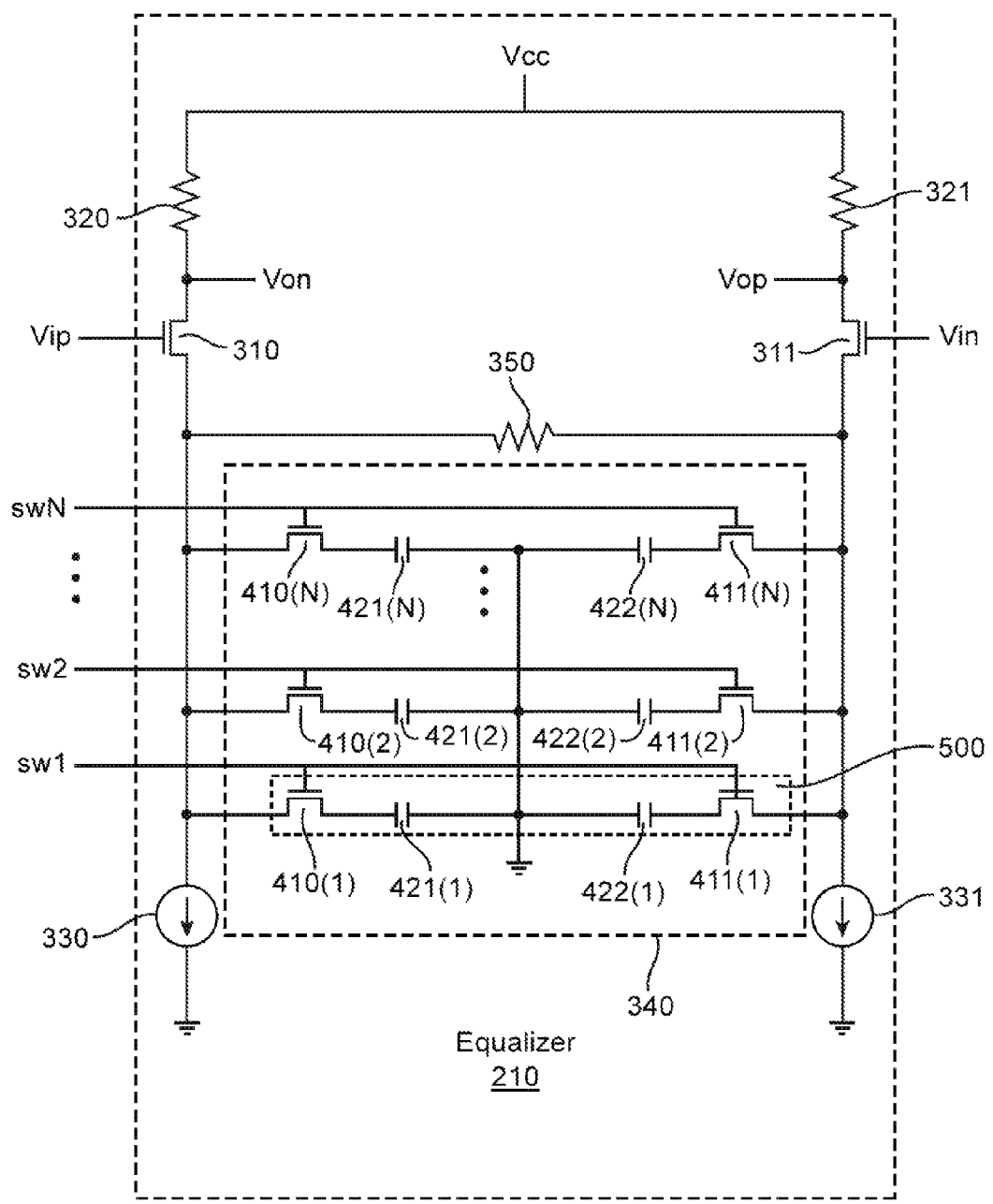
FIG. 4 shows an implementation of an illustrative equalizer circuit having adjustable capacitance circuitry in accordance with one embodiment of the present invention.

FIG. 4, meant to be illustrative and not limiting, illustrates an implementation of adjustable-capacitance circuitry 340 for equalizer circuit 210 in accordance with one embodiment of the present invention. Adjustable-capacitance circuitry 340 includes NMOS transistors 410(1)-410(N), NMOS transistors 411(1)-411(N), capacitors 421(1)-421(N) and 422(1)-422(N). Capacitors 421(1)-421(N) and 422(1)-422(N) may have different capacitance values. However, in the embodiment of FIG. 4, each of capacitors 421(1)-421(N) and 422(1)-422(N) has identical capacitance values.

Referring still to FIG. 4, drain terminals of respective n-channel transistors 410(1)-410(N) are coupled to respective nodes 431(1)-431(N). On the other hand, drain terminals of respective NMOS transistors 411(1)-411(N) are coupled respective nodes 432(1)-432(N). The gate terminals of respective n-channel transistors 410(1)-410(N) and 411(1)-411(N) may receive respective digital control signals sw1-swN. For example, the respective gate terminals of n-channel transistors 410(1) and 411(1) may receive digital control signal sw1, the gate terminals of n-channel transistors 410(2) and 411(2) may receive digital control signal sw2, and so on.

Source terminals of n-channel transistors 410(1)-410(N) are coupled to the respective terminals of capacitors 421(1)-421(N) whereas source terminals of n-channel transistors 411(1)-411(N) are coupled the respective terminals of capacitors 422(1)-422(N). In the embodiment of FIG. 4, another terminal of each of capacitors 421(1)-421(N) and 420(1)-420(N) is coupled to ground. It should be appreciated that n-channel transistors 410(1) and 411(1) and capacitors 421(1) and 422(1) may collectively form an adjustable-capacitance element 500 as part of adjustable-capacitance circuitry 340.

Adjustable-capacitance circuitry 340 may adjust the effective capacitance of equalizer circuit 210 through digital control signals sw1-swN. For example, n-channel transistors 410(1) and 411(1) may be switched on when control signal sw1 is at a logic high level. In this instance, current may flow through capacitors 421(1) and 422(1). Accordingly, n-channel transistors 410(1), 410(2), 411(1) and 411(2) may be switched on when control signals sw1 and sw2 are at a logic high level. Consequently, in this instance, current may flow through capacitors 421(1), 422(1), 421(2) and 422(2). It should be appreciated that when current flows through different capacitors in equalizer circuit 210, the capacitance within the transfer function of equalizer circuit 210 may be altered. In one embodiment, the relationship between the input signal and output signal (e.g., the transfer function of equalizer circuit 210) may be represented by the following equation:

$$V(vop, von)/V(vip,vin) = -gm*RL(1+s*Cs*Rs)/(1+s*Cs*Rs+gm*Rs)$$

where vip is defined as the positive differential input signal, where vin is defined as the negative differential input signal, where vop is defined as the positive differential output signal, where von is defined as the negative differential output signal, where gm is defined as the small-signal transconductance of the input transistors, and where s is equal to the number of sw signals that are at a logic high level.

In all of the described exemplary embodiments, the number of capacitors within adjustable-capacitance element 500 may be different from the number of capacitors shown in FIG. 4. In the case of the exemplary embodiment of FIG. 4, there are two capacitors within adjustable-capacitance element 500. However, in alternative adjustable-capacitance elements, there may be more than two capacitors. An upper limit for the number of capacitors may be determined, for example, by the available area in an integrated circuit.

Furthermore, the number of adjustable-capacitance elements 500 in an equalizer circuit (e.g., equalizer circuit 210) may also be different. In one embodiment, the number of adjustable-capacitance elements 500 required in an equalizer circuit may depend on the application for which that equalizer circuit 210 is being used for. In another embodiment, the number of adjustable-capacitance elements 500 may be limited by available resources or space on the integrated circuit.

Figure 5A:
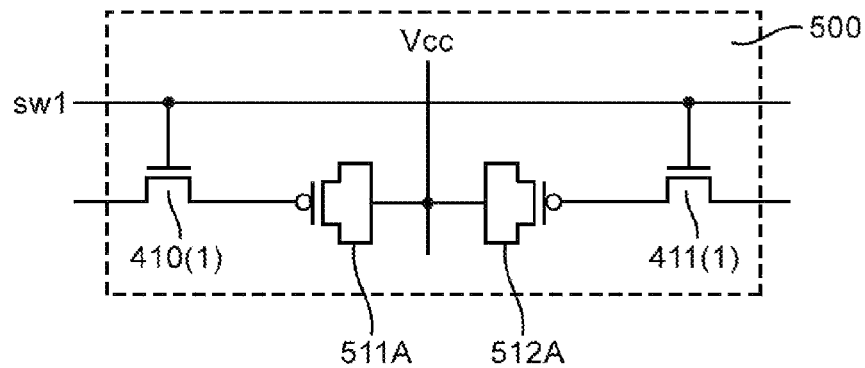
FIGS. 5A-5C show exemplary implementations of adjustable-capacitance elements in accordance with one embodiment of the present invention.
Figure 5B:
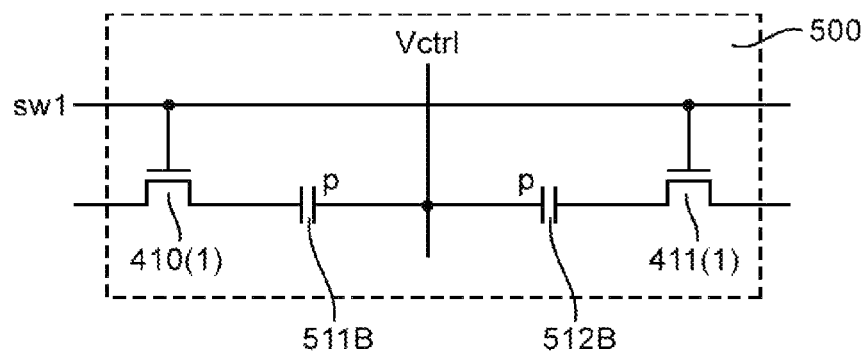
Figure 5C:
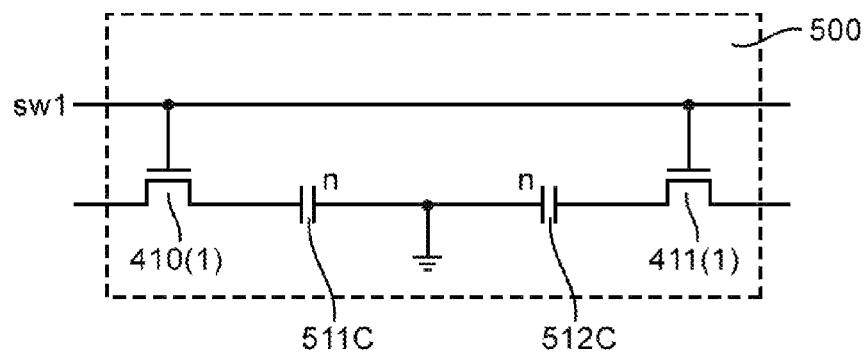

FIGS. 5A-5C, meant to be illustrative and not limiting, illustrate possible implementations of adjustable-capacitance elements 500 in accordance with the present invention. FIGS. 5A-5C may include common elements such as NMOS transistors 410(1) and 411(1). FIGS. 5A-5C also show adjustable capacitance elements 500 with varied capacitive elements. In FIG. 5A, the capacitive elements are p-channel metal oxide semiconductor (PMOS) transistors 511A and 512A. PMOS transistors 511A and 512A may have their source and drain terminals coupled to a supply voltage (Vcc) and their gate terminals coupled to drain terminals of respective NMOS transistors 410(1) and 411(1).

In FIG. 5B, the capacitive elements are PMOS varactors 511B and 512B, and in FIG. 5C, the capacitive elements are NMOS varactors 511C and 512C. PMOS varactors 511B and 512B each have one of their terminals coupled to Vcc and one of their terminals to the respective n-channel transistors 410(1) and 411(1). In contrast, NMOS varactors 511C and 512C each have one of their terminals coupled to ground and the other of their terminals coupled to the respective n-channel transistors 410(1) and 411(1). Such a device is useful in the design and construction of oscillator circuits commonly used for, among other things, communications devices.

Figure 6:
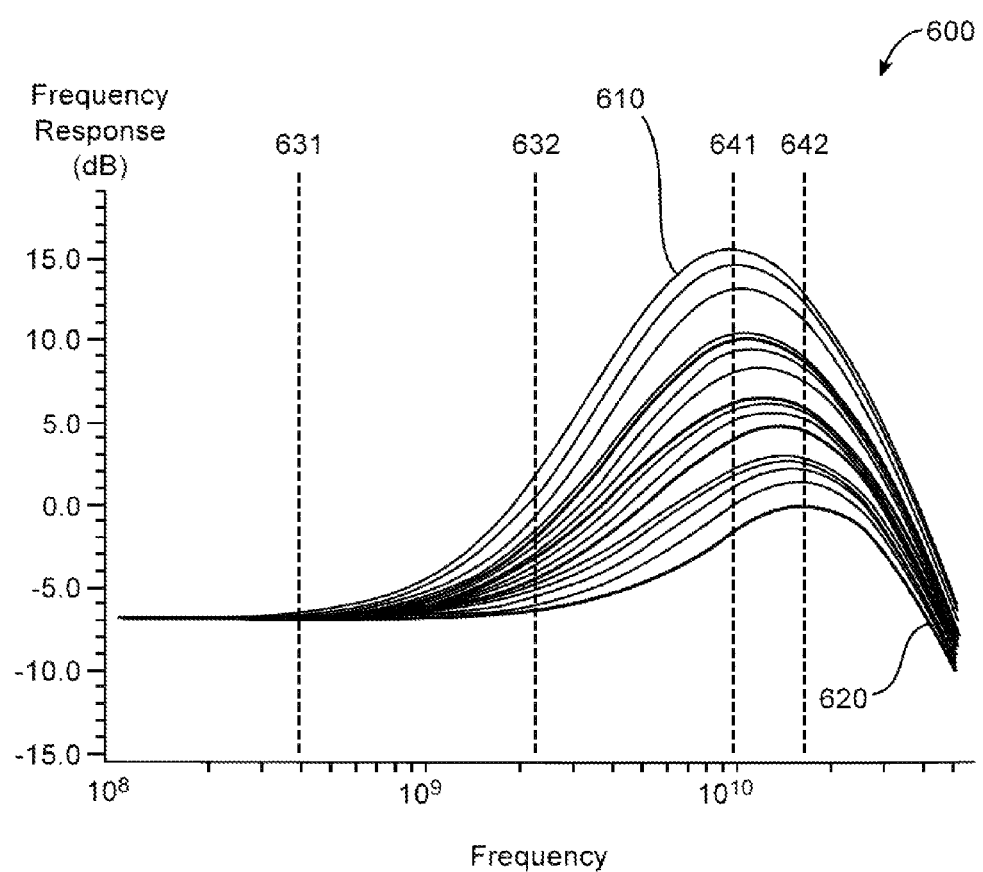
FIG. 6 shows frequency responses of an equalizer circuit when applied with various digital control signals in accordance with one embodiment of the present invention.

FIG. 6, meant to be illustrative and not limiting, illustrates a plurality of frequency responses of an equalizer circuit (e.g., equalizer circuit 210 of FIG. 3) under different digital control signals in accordance with one embodiment of present invention. Each of frequency responses 600 may be generated by supplying different digital control signals (sw1-swN) to adjustable-capacitance circuitry 340 of FIG. 4. As shown in the embodiment of FIG. 6, the shape of the plurality of frequency responses 600 may depend on the effective capacitance value (e.g., capacitance value, C) of capacitors 421(1)-421(N) and 422(1)-422(N). In one embodiment, the shapes of frequency responses 600 are based on the equation described in connection with FIG. 4.

Frequency responses 600 include a plurality of frequency responses, specifically including frequency responses 610 and 620. Based on a comparison, frequency response 610 bends upwards from −7.0 decibels (dB) at a lower frequency compared to frequency response 620. It should be appreciated that frequency response 610 bends upward at the frequency marked by dotted line 631 and frequency response 620 begins to substantially bend upward at the frequency marked by dotted line 632. Therefore, frequency response 610 may exhibit an input signal being amplified at lower frequencies in comparison to frequency response 620. Furthermore, frequency response 610 also has a lower bandwidth compared to frequency response 620. The bandwidth for frequency response 610 is determinable based on the peak of frequency responses 610 and 620, which is at the intersection of line 641 for frequency response 610 and at the intersection of line 642 for frequency response 620.

It should be appreciated that the shape of each frequency response depends on poles and zeros of the transfer function (e.g., the relationship between input signal and output signal as described in FIG. 4). Having more logic high control signals increases the effective capacitance, and hence shifts the peak from low value to high value, which gives more high frequency boosting to compensate higher channel loss. Therefore, in the embodiment of FIG. 6, frequency response 620 has fewer control signals at a logic high level compared to frequency response 610.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit, comprising:
an equalizer circuit that provides high-frequency signal boosting and that includes adjustable impedance circuitry, wherein the adjustable impedance circuitry receives digital control signals and comprises:
a first capacitor having first and second terminals;
a second capacitor having first and second terminals; and
a control terminal that is connected to the first terminal of the first capacitor and to the first terminal of the second capacitor.

2. The integrated circuit defined in claim 1, wherein the adjustable impedance circuitry further comprises:
first and second switches, wherein the first and second capacitors are coupled in series between the first and second switches.

3. The integrated circuit defined in claim 2, wherein the first and second switches comprises first and second transistors having gate terminals that receive at least some of the digital control signals.

4. The integrated circuit defined in claim 1, wherein the control terminal comprises a power supply terminal.

5. The integrated circuit defined in claim 1, wherein the control terminal is configured to receive an analog control voltage.

6. The integrated circuit defined in claim 1, wherein the adjustable impedance circuitry further comprises:
a first tunable impedance circuit having a first pair of switches serially coupled to first capacitive circuits that includes the first and second capacitors; and
a second tunable impedance circuit having a second pair of switches serially coupled to second capacitive circuits, wherein the first and second tunable impedance circuits are coupled in parallel.

7. The integrated circuit defined in claim 6, wherein the equalizer circuit further comprises a resistor coupled in parallel with the first and second tunable impedance circuits.

8. The integrated circuit defined in claim 1, wherein the adjustable impedance circuit has a first terminal and a second terminal, the equalizer circuit further includes:
first and second loading circuits;
a first input transistor having a first source-drain terminal that is coupled to the first terminal of the adjustable impedance circuit and a second source-drain terminal that is coupled to a power supply terminal via the first loading circuit; and
a second input transistor having a first source-drain terminal that is coupled to the second terminal of the adjustable impedance circuit and a second source-drain terminal that is coupled to the power supply terminal via the second loading circuit, wherein the first and second input transistors are operable to receive a differential signal for the equalizer circuit.

9. A channel equalizer circuit, comprising:
first and second output terminals;
a first input transistor having a first source-drain terminal and a second source-drain terminal, wherein the first source-drain terminal is coupled to the first output terminal;
a second input transistor having a first source-drain terminal and a second source-drain terminal, wherein the first source-drain terminal is coupled to the second output terminal; and
adjustable impedance circuitry having:
a first terminal that is coupled to the second source-drain terminal of the first input transistor,
a second terminal that is coupled to the second source-drain terminal of the second input transistor,
control terminals operable to receive digital signals for adjusting an impedance of the adjustable impedance circuitry,
first and second capacitive circuits coupled in series between the first and second terminals of the adjustable impedance circuitry, and
a power supply terminal interposed between the first and second capacitive circuits.

10. The channel equalizer circuit defined in claim 9, wherein the adjustable impedance circuitry further comprises:
a pair of switches coupled serially to the first and second capacitive circuits.

11. The channel equalizer circuit defined in claim 10, wherein the pair of switches is switched on when receiving logic high digital signals.

12. The channel equalizer circuit defined in claim 10, wherein the first and second capacitive circuits are selected from a group consisting of: metal plate capacitors, varactors, and transistors.

13. The channel equalizer circuit defined in claim 10, wherein the switches are selected from a group consisting of: n-channel transistors and p-channel transistors.

14. The channel equalizer circuit defined in claim 10, wherein the first and second capacitive circuits have identical capacitance values.

15. The channel equalizer circuit defined in claim 10, wherein the digital signals received by the adjustable impedance circuit comprise static control bits supplied using memory elements.

16. A method of operating an equalizer circuit, the method comprising:
receiving a first set of digital control signals with an adjustable impedance circuit in the equalizer circuit so that the equalizer circuit exhibits a first high-frequency boosting characteristic, wherein the adjustable impedance circuit includes first and second capacitive circuits coupled in series;
receiving a second set of digital control signals with the adjustable impedance circuit in the equalizer circuit so that the equalizer circuit exhibits a second high-frequency boosting characteristic that is different than the first high-frequency boosting characteristic; and
with a voltage bias terminal, applying a bias voltage to the first and second capacitive circuits.

17. The method defined in claim 16, further comprising:
turning on switches within the adjustable impedance circuit according to the received digital control signals.

18. The method defied in claim 16, further comprising:
receiving a differential input signal at a pair of input transistors in the equalizer circuit, wherein the differential signal gets boosted according to the first high-frequency boosting characteristic; and receiving another differential input signal at the pair of input transistors in the equalizer circuit, wherein the another differential signal gets boosted according to the second high-frequency boosting characteristic.

19. The method defined in claim 16, wherein the first and second high-frequency boosting characteristics have different effects on an input signal in terms of an amount of amplification that is applied to the input signal and the range of frequency within which the input signal is amplified.

\* \* \* \* \*